United States Patent
Tani et al.

(10) Patent No.: US 6,521,105 B2
(45) Date of Patent: Feb. 18, 2003

(54) SPUTTERING APPARATUS

(75) Inventors: Noriaki Tani, Chiba (JP); Kazuhiko Saito, Shizuoka (JP); Koukou Suu, Chiba (JP)

(73) Assignee: Ulvac, Inc., Chigasaki (JP)

( * ) Notice: Subject to any disclaimer, the term of this patent is extended or adjusted under 35 U.S.C. 154(b) by 0 days.

(21) Appl. No.: 09/909,852

(22) Filed: Jul. 23, 2001

(65) Prior Publication Data

US 2002/0043457 A1 Apr. 18, 2002

(30) Foreign Application Priority Data

Jul. 25, 2000 (JP) ........................................ 2000-223195

(51) Int. Cl.$^7$ ............................................. C23C 14/34
(52) U.S. Cl. ............................. 204/298.06; 204/298.11; 204/298.14; 204/298.15
(58) Field of Search ................... 204/298.06, 298.11, 204/298.15, 298.14

(56) References Cited

U.S. PATENT DOCUMENTS

| | | | | |
|---|---|---|---|---|
| 4,038,171 A | * | 7/1977 | Moss et al. | 204/298.06 |
| 5,997,704 A | * | 12/1999 | Shiono et al. | 204/298.12 |
| 6,296,743 B1 | * | 10/2001 | Talieh | 204/192.12 |

FOREIGN PATENT DOCUMENTS

| | | | |
|---|---|---|---|
| JP | 04048073 A | * | 2/1992 |
| JP | 09176850 A | * | 7/1997 |

* cited by examiner

*Primary Examiner*—Patrick Ryan
*Assistant Examiner*—Gregg Cantelmo
(74) *Attorney, Agent, or Firm*—Armstrong, Westerman & Hattori, LLP.

(57) ABSTRACT

In order to provide technology where film deposition speed and Sr/Ti composition ratio is constant even when forming dielectric films consecutively on a plurality of substrates using sputtering techniques, a sputtering apparatus is provided with an opposing electrode located about the periphery of a mounting table at an inner bottom surface of a vacuum chamber. Further, a multiplicity of holes are formed at the surface of the opposing electrode so that the surface area of the opposing electrode is large. Sputtering dielectric material becomes affixed to the surface of the opposing electrode so that a dielectric film is formed at this surface. The charge density of charge distributed at the surface of the opposing electrode is therefore small compared with the related art even when positive charge is distributed. The potential of the opposing electrode surface can therefore be kept substantially at earth potential.

6 Claims, 6 Drawing Sheets

SPUTTERING APPARATUS

BACKGROUND OF THE INVENTION

1. Field of the Invention

The present invention relates to a vacuum processing device and particularly relates to improvements in a sputtering apparatus.

2. Description of Related Art

Reference numeral 101 in FIG. 8 shows a related sputtering apparatus. This vacuum processing device 101 has a vacuum chamber 111.

An exhaust opening part 118 is provided at the vacuum chamber 111. The exhaust opening part 118 is connected to a vacuum exhaust system (not shown) so that when the vacuum exhaust system is driven, the contents of the vacuum chamber 111 can be evacuated.

A gas introduction opening part 117 is provided at the vacuum chamber 111. This gas introduction opening part 117 is connected to a gas introduction system (not shown). Gas can also be introduced to the inside of the vacuum chamber 111 from the gas introduction opening part 117.

A backing plate 112 is located at the ceiling of the vacuum chamber 111 and a target 113 consisting of a dielectric material is located at a side of the backing plate 112 facing the inside of the vacuum chamber 111.

A mounting table 115 facing the target 113 is located at the inside bottom surface of the vacuum chamber 111. The surface of the mounting table 115 is flat and a substrate can be mounted on this surface as described later.

A radio-frequency supply 114 is provided at the outside of the vacuum chamber 111. This radio-frequency supply 114 is connected to a backing plate 112 so that when the radio-frequency supply 114 is activated, radio-frequency power can be supplied to the target 113 via the backing plate 112.

In order to form a thin film of dielectric using sputtering techniques on a surface of a silicon substrate using a sputtering apparatus 101 of this configuration, first, the inside of the vacuum chamber 111 is evacuated, and a substrate 120 is transported towards the inside of the vacuum chamber 111 and mounted on the surface of a mounting table 115 while maintaining a vacuum atmosphere. The potential of the substrate 120 is floating at this time.

Next, a discharge occurs when radio-frequency power is supplied to the target 113 while introducing a constant amount of sputtering gas such as Argon gas etc. from the gas introduction opening part 117. An adhesion preventing plate 119 is connected to earth so that the discharge occurring within the vacuum chamber 111 is stable.

When discharge occurs, the target 113 is sputtered. At this time, in addition to flying off in the direction of the surface of the substrate 120, the sputtered target material also flies off in the direction of the side surface of the inside of the vacuum chamber 111 and in the direction of the inner bottom surface. However, an adhesion preventing plate 119 formed substantially in a semi-spherical shape with a circular opening part in the bottom thereof is provided on the inside of the vacuum chamber 111. The opening part in the bottom of the adhesion preventing plate 119 is positioned close to the mounting table 115, with the target 113, side surface within the vacuum chamber 111 and the inner bottom surface being partitioned by the adhesion preventing wall 119 so that the sputtered target material does not become directly attached to the inside bottom surface or inside side surface of the vacuum chamber 111. A thin film is then formed on the surface of the substrate 120 from target material reaching the surface of the substrate 120.

However, according to the sputtering apparatus of the above configuration, in particular, while a thin film of dielectric is being formed, when a plurality of films are formed on the substrate consecutively, the distribution of the thickness of the film on the substrate surface and the film-deposition speed change. Discharge therefore cannot be maintained due to discharge becoming unstable when deposition of thin films is continued.

In order to resolve the aforementioned problems of the related art, it is therefore the object of the present invention to provide technology where, when depositing thin films using sputtering techniques, discharge is stable and film deposition speed and film thickness distribution are uniform even in cases where a plurality of dielectric films are formed consecutively on a substrate.

SUMMARY OF THE INVENTION

In order to resolve the aforementioned problems, in a first aspect of the present invention, a sputtering apparatus comprises a vacuum chamber, a target positioned within the vacuum chamber, a substrate support, located within the vacuum chamber opposite the target, capable of supporting the substrate, and an opposing electrode connected to earth located about the periphery of the substrate support with a surface thereof facing the target, the surfaces being uneven.

With a second aspect of the present invention, the opposing electrode has a through-hole at the center thereof, and the substrate support is located within the through-hole.

In a third aspect of the present invention, the unevenness is comprised of a plurality of holes formed in the surface of the opposing electrode for the sputtering apparatus according to the first aspect.

A fourth aspect of the present invention is the sputtering apparatus according to the third aspect, wherein the depth of the holes is at least twice the diameter of the holes.

In a fifth aspect of the present invention, with the sputtering apparatus according to the first aspect, the target is positioned on the side of the inside ceiling of the vacuum chamber; the opposing electrode being located at an inner bottom side of the vacuum chamber; and wherein the surface of the opposing electrode is inclined in such a manner that the height of the outer side is lower than the height of the inner side.

With a sixth aspect of the present invention, for the sputtering apparatus according to the fifth aspect, the surface of the opposing electrode is inclined by at least 10° with respect to a horizontal plane.

In a seventh aspect of the present invention, the target for the sputtering apparatus according to the first aspect is a dielectric selected from the group consisting of $BaTiO_3$, $SrTiO_3$, $(BaSr)TiO_3$, $Pb(ZrTi)O_3$, and $SrBi_2Ta_2O_9$.

In an eighth aspect of the present invention, with the sputtering apparatus according to the first aspect, only the opposing electrode is connected to earth within the vacuum chamber.

With the related sputtering apparatus described above, when a thin film of dielectric is formed, when films are formed consecutively, the distribution of the thickness of the film on the substrate surface and the film-deposition speed change, thereby causing discharge to become unstable when forming of films is continued. The inventor conceived the present invention in order to overcome a problem where, when dielectric becomes affixed to the surface of an adhesion preventing plate located in a position close to the target or substrate during sputtering, so that a dielectric film is formed, positive charge becomes affixed to the surface of the dielectric film, and the charge distribution density of positive charge occurring at the surface of the adhesion preventing plate becomes large, the potential of the surface of the adhesion preventing plate can no longer be held at earth potential and the discharge therefore becomes unstable.

The sputtering apparatus of the present invention is conceived based on this concept and is therefore provided with an opposing electrode, held at earth potential, with a surface that is made uneven as a result of forming, for example, a plurality of holes in the surface, with the opposing electrode being located at a position at the periphery of the mounting table within the vacuum chamber. Target material therefore does not become directly attached to the inner bottom surface of the vacuum chamber when the target is sputtered because the target material instead becomes affixed to the adhesion preventing plate and the opposing electrode.

Further, the surface area of the opposing electrode is large because a multiplicity of holes are formed at the surface of the opposing electrode. Sputtered dielectric material therefore becomes affixed to the surface of the opposing electrode and to the inside of the holes so that a dielectric film is formed at this surface. The charge density of distributed charge is therefore small compared with the related art even when positive charge is distributed at the dielectric film because the surface area of the opposing electrode surface is large. The potential of the opposing electrode surface can therefore be kept substantially at earth potential.

Discharges within the vacuum chamber are therefore stable compared with the related art even when dielectric films are consecutively formed because the potential of the surface of the opposing electrode is kept substantially at earth potential. It is therefore difficult for the fluctuations in film thickness distribution and film deposition speed and instabilities in the discharges that occur in the related art to occur.

When a plurality of shallow holes are formed in the opposing electrode, the surface area of the opposing electrode is small compared to when the holes are deep. When a large number of substrates are then processed, there are cases where the potential of the opposing electrode surface cannot be held at earth potential. However, in the present invention, a multiplicity of deep holes where the depth of the holes is two times or more greater than the diameter of the holes are formed. The surface area of the opposing electrode is therefore large compared to the case where holes are not formed. The potential of the surface of the opposing electrode can therefore be maintained at earth potential for a long period of time and the discharge can be maintained in a stable manner for a long period of time.

In the present invention, the surface of the opposing electrode is inclined in the direction of the side surface on the inner side of the vacuum chamber.

DETAILED DESCRIPTION OF THE PREFERRED EMBODIMENTS

The following is a detailed description, with reference to the drawings, of embodiments of the present invention.

Figure 1:
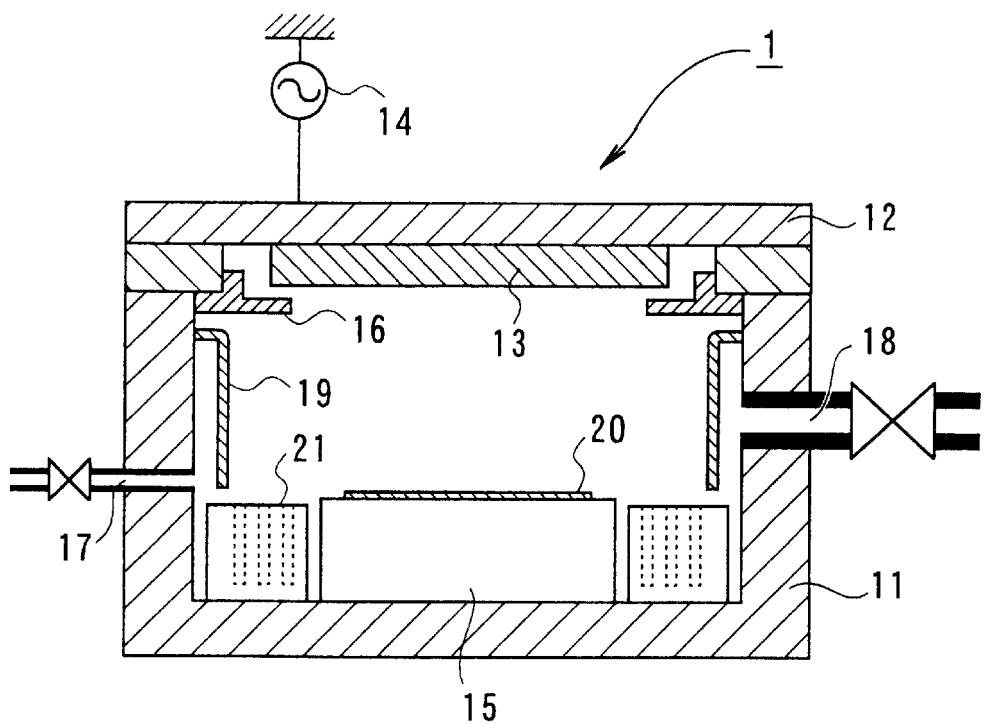
FIG. 1 is a cross-sectional view illustrating a configuration of a sputtering apparatus of an embodiment of the present invention.

Reference numeral 1 in FIG. 1 shows a sputtering apparatus of a first embodiment of the present invention. The sputtering apparatus 1 has a vacuum chamber 11.

An exhaust opening part 18 is provided at the vacuum chamber 11. The exhaust opening part 18 is connected to a vacuum exhaust system (not shown) so that when the vacuum exhaust system is driven, the contents of the vacuum chamber 11 can be evacuated.

A gas introduction opening part 17 is provided at the vacuum chamber 11. This gas introduction opening part 17 is connected to a gas introduction system (not shown). Gas can also be introduced to the inside of the vacuum chamber 11 from the gas introduction opening part 17.

A backing plate 12 insulated from the vacuum chamber 11 is located at the ceiling of the vacuum chamber 11; and a target 13 consisting of a sintered body of $SrTiO_3$ is located at a side facing the inside of the vacuum chamber 11 of the backing plate 12. An earth shield 16 connected to earth is positioned at the inner surface of the inner part of the vacuum chamber 11 so as to face the periphery of the surface of the target 13.

A mounting table 15 facing the target 13 is located at the inside bottom surface of the vacuum chamber 11. The surface of the mounting table 15 is flat; and a substrate can be mounted on this surface as described later.

An opposing electrode 21 of the inside bottom surface of the vacuum chamber 11 is located at a position at the periphery of the mounting table 15.

Figure 2A:
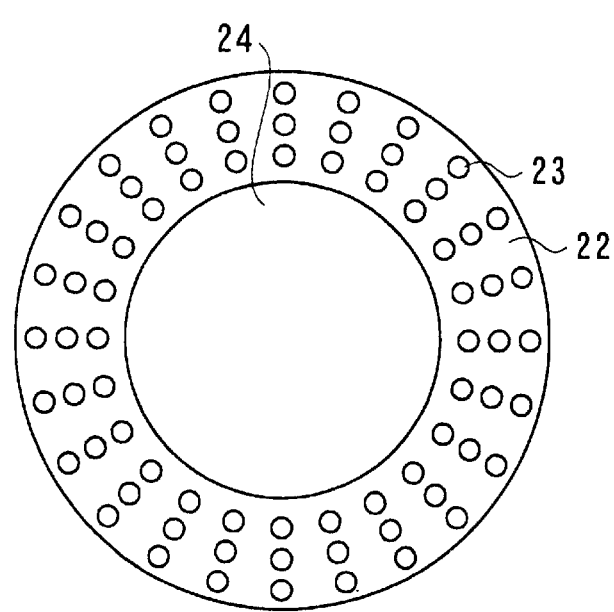
FIG. 2(a) is a plan view illustrating an example of an opposing electrode employed by a sputtering apparatus of the first embodiment of the present invention.
Figure 2B:
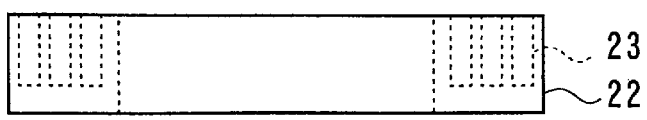
FIG. 2(b) is a cross-sectional view illustrating an example of an opposing electrode employed by a sputtering apparatus of the first embodiment of the present invention.

The detailed structure of the opposing electrode 21 is shown in FIG. 2(a) and FIG. 2(b). The opposing electrode 21 has an aluminum disc 22 having a circular through-hole at the center thereof, with a plurality of circular holes 23 being formed at the surface of the disc 22. The diameter of the disc 22 is taken to be 26 cm, the diameter of the through-hole is taken to be 20 cm, with 72 holes 23 of diameters of 5 mm and depths of 10 mm being provided at the surface of the disc 22. The mounting table 15 is then positioned within the through-hole 24.

The adhesion preventing plate 19 is provided in the vicinity of the inner side surface of the vacuum chamber 11. The upper end of the adhesion preventing plate 19 is fixed to the inner upper side of the vacuum chamber 11 and the lower end is positioned close to the inner side surface of the vacuum chamber 11 substantially parallel with the inner side surface so as to be positioned close to the surface of the opposing electrode 21.

A radio-frequency supply 14 is provided at the outside of the vacuum chamber 11. This radio-frequency supply 14 is connected to a backing plate 12 so that when the radio-frequency supply 14 is activated, radio-frequency power can be supplied to the target 13 via the backing plate 12.

In order to form a thin film of $SrTiO_3$ dielectric on the surface of an 8-inch (approximately 20 cm) silicon substrate using a sputtering apparatus of this configuration, first, the inside of the vacuum chamber 11 is evacuated, a silicon substrate 20 is transferred into the inside of the vacuum chamber 11 while maintaining a vacuum atmosphere and the substrate 20 is mounted on the surface of the mounting table 15.

Next, 10 SCCM of Argon gas (Ar) and 1 SCCM of oxygen gas ($O_2$) is introduced as sputtering gas to the inside of the vacuum chamber 11 from the gas introduction opening part 17, so as to give a pressure within the vacuum chamber 11 of 0.1 Pa. After this, the radio-frequency supply 14 is activated and radio-frequency power of 13.56 MHz of RF power of 1 kW is supplied to the target 13 so that a discharge occurs within the vacuum chamber 11. When discharge occurs, the target 13 is sputtered.

At this time, in addition to flying in the direction of the surface of the substrate 20 located directly below the target 13, the sputtered target material also flies in the direction of the inner side surface and the inner bottom surface of the vacuum chamber 11. However, the adhesion preventing plate 19 is located at the inner side of the vacuum chamber 11 and the opposing electrode 21 is located about the periphery of the mounting table 15 at the inner bottom surface of the vacuum chamber 11. The flying target material therefore does not directly become affixed to the inner side surface or the inner bottom surface of the vacuum chamber 11. A thin film of $SrTiO_3$ is then formed at the surface of the substrate 20 by sputtering $SrTiO_3$ onto the surface of the substrate 20.

When a thin film of $SrTiO_3$ is formed to a prescribed film thickness on the surface of the substrate 20, introducing of the Ar gas and $O_2$ gas constituting the sputtering gas is introduced and supplying of the radio-frequency power are stopped. The sputtering processing has thus become complete; and the substrate 20 for which processing has been completed is taken outside of the vacuum chamber 11 while maintaining a vacuum atmosphere within the vacuum chamber 11.

A new substrate is then transferred to the inside of the vacuum chamber 11 while maintaining a vacuum atmosphere within the vacuum chamber 11 and the same thin film processing as described above is again carried out. It is then possible to form $SrTiO_3$ thin films consecutively on a plurality of substrates by repeating this thin-film deposition process a plurality of times.

Figure 3:
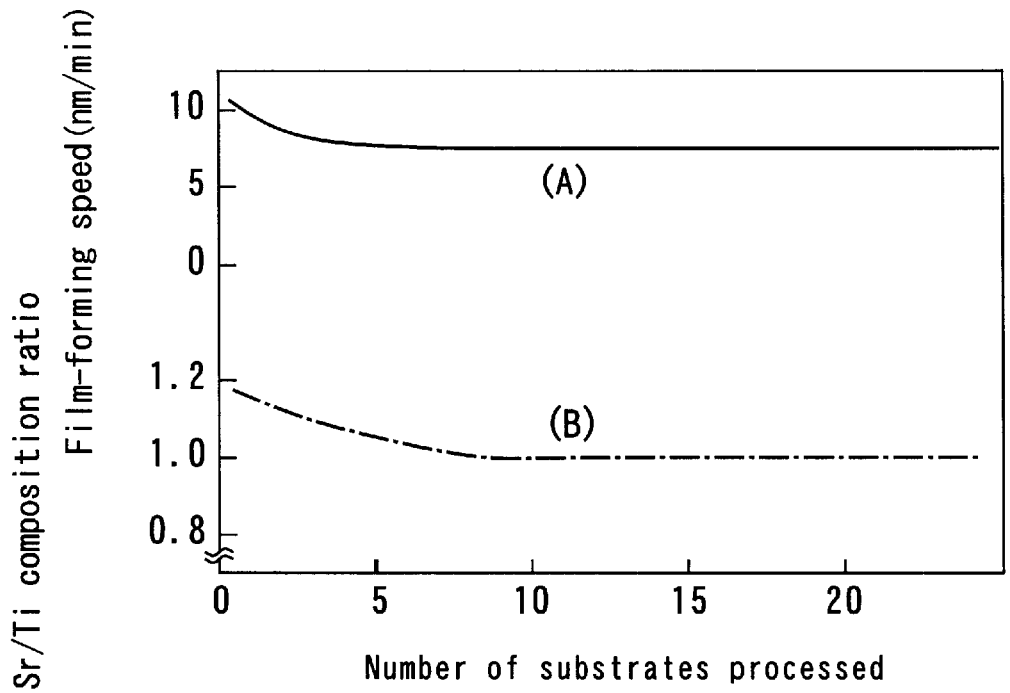
FIG. 3 is a graph illustrating a relationship between a number of substrates processed, film deposition speed and Sr/Ti composition ratio when films consecutively using the sputtering apparatus of the first embodiment of the present invention.

The inventor of the present invention subjected a plurality of substrates to thin-film deposition processing and then sequentially measured film-deposition speed and Sr/Ti composition ratios for each substrate. The results of these measurements are shown by the curves (A) and (B) in FIG. 3. The curve (A) shows the relationship between the number of substrates processed and the film-deposition speed, and the curve (B) shows the relationship between the number of substrates processed and the Sr/Ti composition ratio.

In curve (A), the film deposition speed for the first substrate is 10 nm/min, but the film deposition speed falls to 8 nm/min for the tenth substrate. However, after this, the film deposition speed does not change and is held at a fixed value of 8 nm/min.

As shown by the curve (B), the Sr/Ti composition ratio for the first substrate is 1.2 but falls to 1.0 for the tenth substrate and thereafter remains constant at 1.0. The inventor of the present invention carried out measurements for up to the 100th substrate processed and during this time, the film deposition speed and the Sr/Ti composition ratio were maintained at a fixed value.

From the tenth substrate onwards, an average of approximately 200 particles of diameters of 0.3 $\mu$m or more were measured as becoming affixed to the surface of the substrates.

According to the sputtering apparatus 1 of this embodiment, the opposing electrode 21 formed with holes 23 at the surface thereof is located about the periphery of the mounting table 15 and the adhesion preventing plate 19 is located so as to be close to the inner side surface of the vacuum chamber 11. Therefore, as with the related art, sputtered $SrTiO_3$ does not come into direct contact with the inner side surface or the inner bottom surface of the vacuum chamber 11.

By forming films consecutively, an $SrTiO_3$ thin film constituted of dielectric is formed at the surface of the opposing electrode 21 so that even if a positive charge is distributed at the surface of the thin film $SrTiO_3$, a multiplicity of holes 23 are formed at the surface of the opposing electrode 21 and the surface area is therefore large. The charge density of positive charge distributed at the surface of the $SrTiO_3$ thin film is therefore relatively small and the potential of the surface of the opposing electrode 21 is held at substantially earth potential. Discharge is therefore stable compared to the related art. Film-deposition speed and Sr/Ti composition ratio of the thin $SrTiO_3$ film can therefore be kept substantially constant for each substrate even when films are formed consecutively on a plurality of substrate surfaces.

Figure 4:
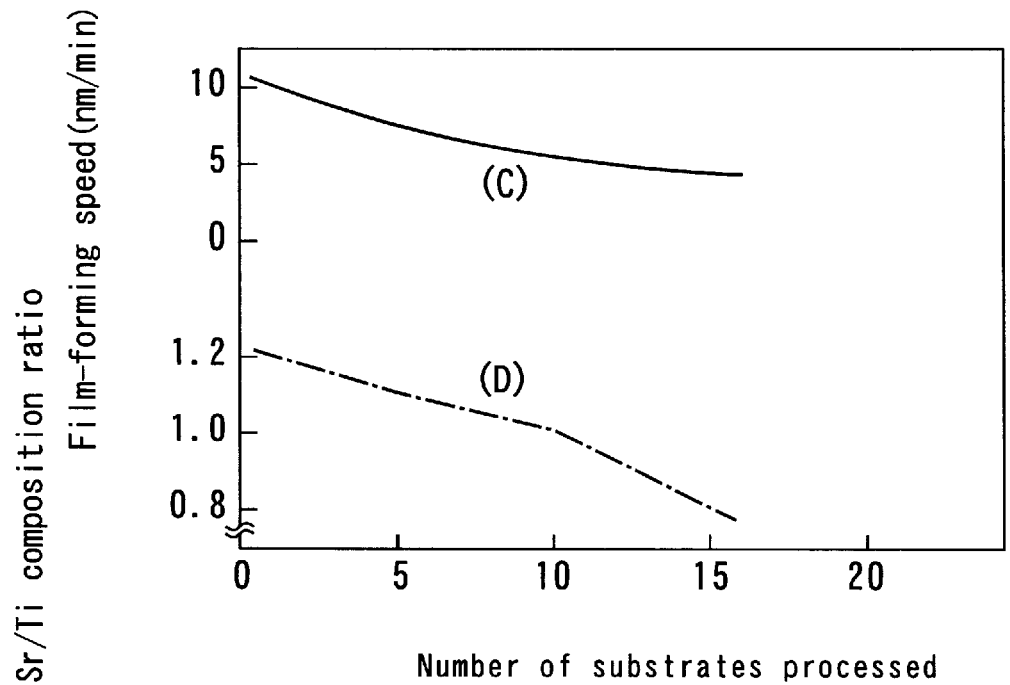
FIG. 4 is a graph illustrating a relationship between a number of substrates processed, film deposition speed and Sr/Ti composition ratio when films consecutively using a related sputtering apparatus.
Figure 8:
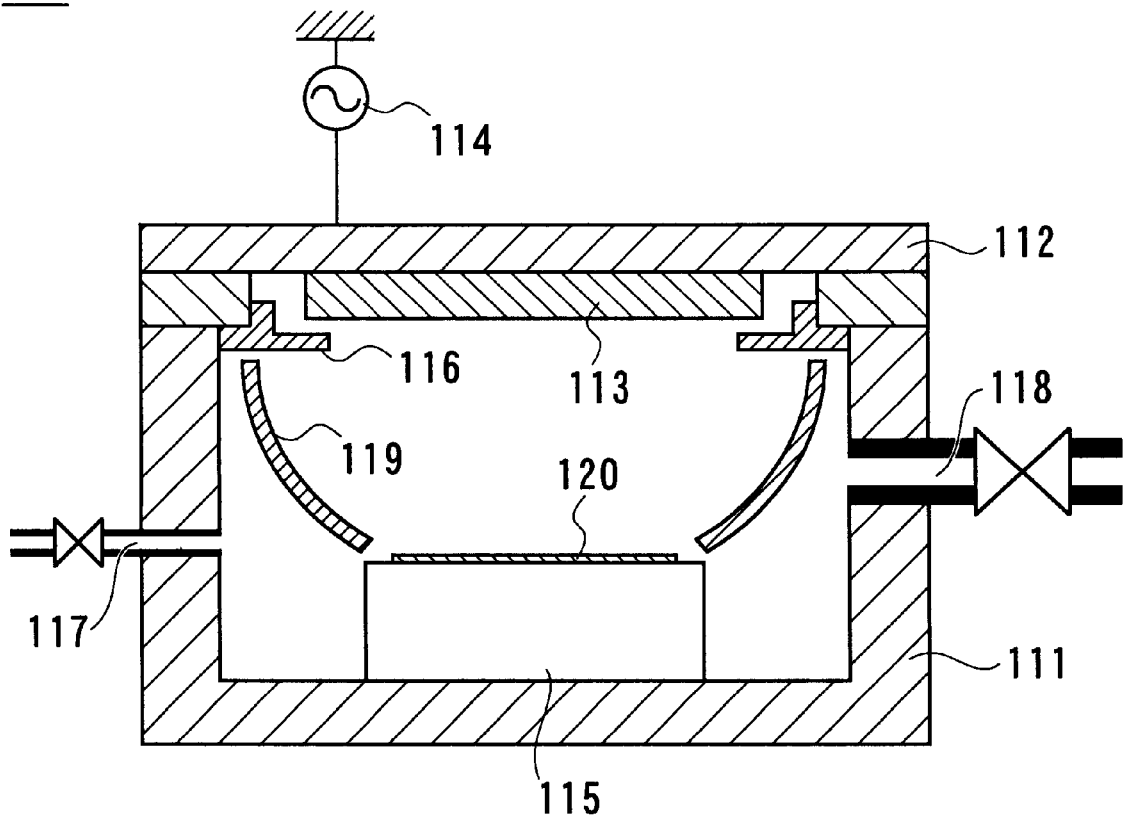
FIG. 8 is a cross-sectional view illustrating a configuration of a related sputtering apparatus.

The inventor of the present invention has employed the related apparatus shown in FIG. 8 for the purpose of comparison with the sputtering apparatus of the above embodiment so that the relationship between the number of substrates processed and the film deposition speed, and the relationship between the number of substrates processed and the Sr/Ti composition ratio when processing of a plurality of consecutive $SrTiO_3$ thin films is carried out on substrate surfaces under the same conditions as for the above embodiment can be investigated. The curve (C) of FIG. 4 shows the relationship between the number of substrates processed and the film-deposition speed, and the curve (D) shows the relationship between the number of substrates processed and the Sr/Ti composition ratio.

As shown by the curve (C), the film-deposition speed of 10 nm/min for the first substrate falls to 4.5 nm/min for the 15th substrate, i.e. falls to 65% of the initial value.

Further, as shown in the curve (D), the Sr/Ti composition ratio is 1.2 for the first substrate and 0.82 for the fifteenth substrate, which is a substantial drop. Discharge therefore does not occur for the 16th substrate onwards even if RF power is supplied to the target 13 and film deposition is therefore not possible.

Figure 5:
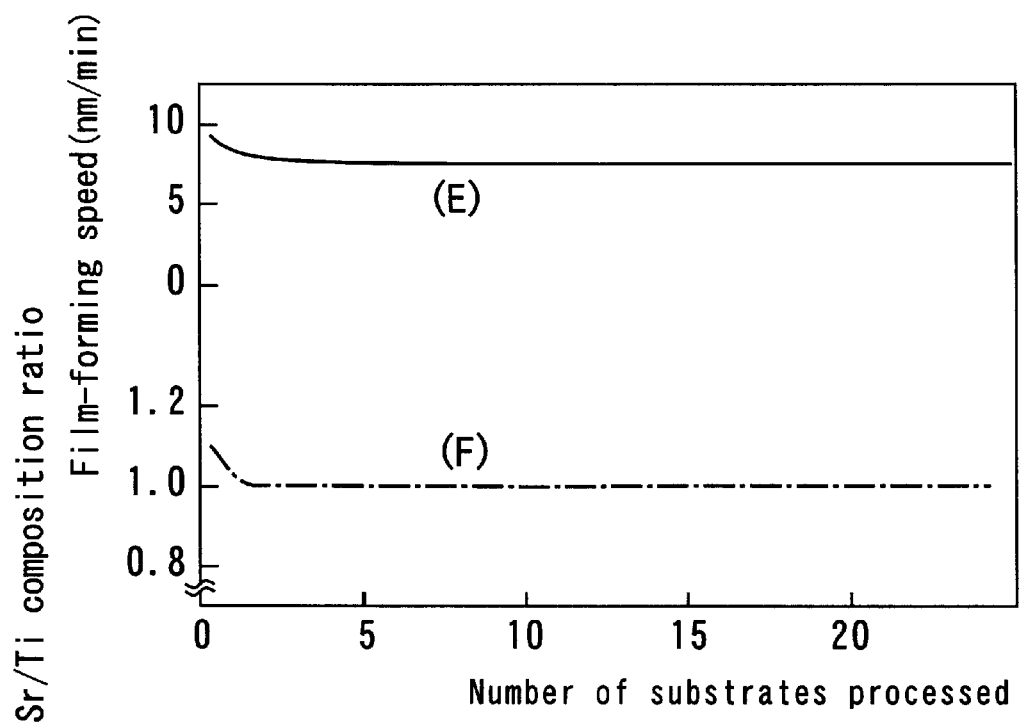
FIG. 5 is a graph illustrating a relationship between a number of substrates processed, film deposition speed and Sr/Ti composition ratio when films consecutively using the sputtering apparatus of a further embodiment of the present invention.

With the sputtering apparatus 1 of FIG. 1, the inventor of the present invention employs an apparatus where the adhesion preventing plate 19 is fixed to the vacuum chamber 11 using insulating glass, the adhesion preventing plate 19 and the earth shield 16 are put at floating potentials, and just the opposing electrode 21 is connected to earth. $SrTiO_3$ thin films are then deposited consecutively at the surfaces of a plurality of substrates under the same conditions as the aforementioned film depositing conditions. The relationship between the number of substrates processed and the film deposition speed, and the relationship between the number of substrates processed and the Sr/Ti composition ratio was then investigated. The curve (E) of FIG. 5 shows the relationship between the number of substrates processed and the film-deposition speed, and the curve (F) shows the relationship between the number of substrates processed and the Sr/Ti composition ratio.

As shown by the curve (E), a film deposition speed of 9 nm/min for the first substrate falls to 8 nm/min for the second substrate, but does not change thereafter (i.e it is kept at a fixed value). As shown by the curve (F), an Sr/Ti composition ratio of 1.1 for the first substrate falls to 1.0 for the second substrate, but does not change thereafter, and it can be confirmed that the film deposition speed and the Sr/Ti composition ratio are fixed.

The inventor of the present invention also investigated extensively whether or not the film deposition speed and Sr/Ti composition ratio become fixed when the plurality of holes 23 are not provided in the opposing electrode 21.

Figure 7A:
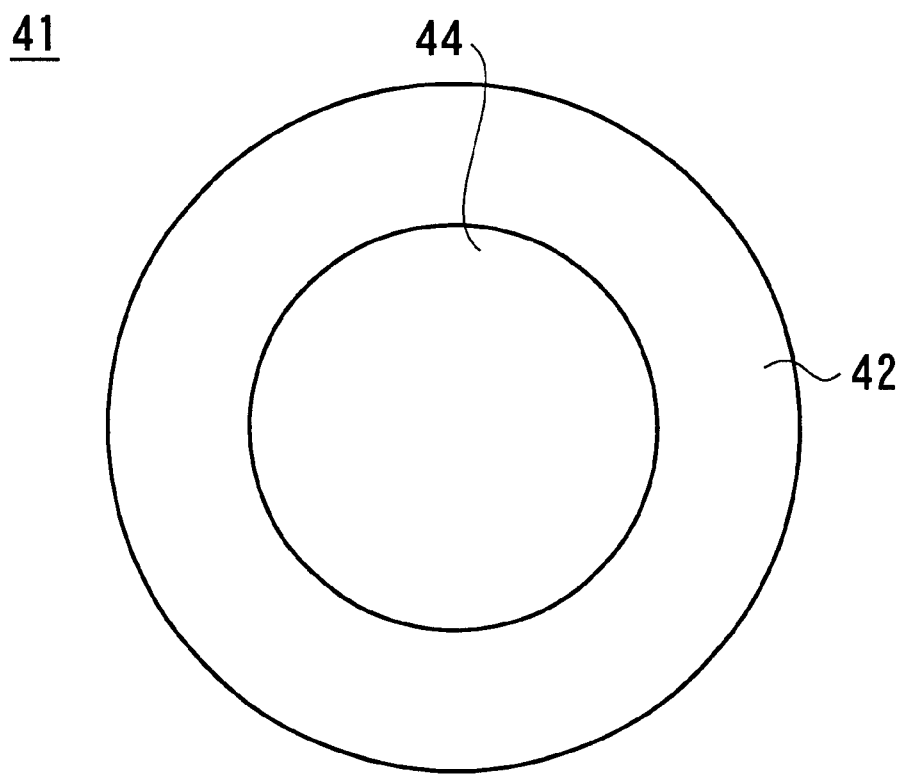
FIG. 7(a) is a plan view illustrating an example of a still further opposing electrode employed by a sputtering apparatus of the first embodiment of the present invention.
Figure 7B:
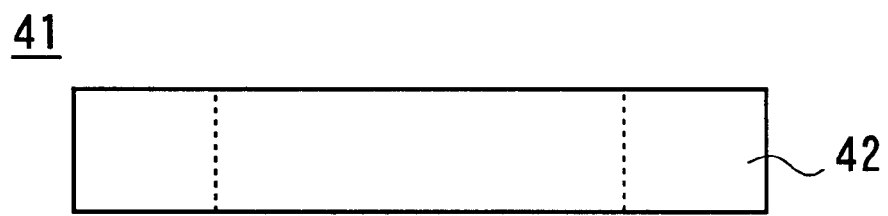
FIG. 7(b) is a cross-sectional view illustrating an example of the still further opposing electrode employed by a sputtering apparatus of the first embodiment of the present invention.

The structure of the opposing electrode is shown by reference numeral 41 in FIG. 7(a) and FIG. 7(b). The opposing electrode 41 is the same as the opposing electrode 21 of FIG. 2 in that a circular through-hole 44 is provided at the center of the disc 42, but differs from the opposing electrode 21 of FIG. 2 in that holes are not provided at the surface of the disc 42 at all. This is the only point of difference and the diameter of the disc 42 and the diameter of the through-hole 44 are both the same as the opposing electrode 21 of FIG. 2.

The opposing electrode 41 of this structure is located at the periphery of the mounting table 15 in place of the opposing electrode 21 of FIG. 1, $SrTiO_3$ thin films are deposited consecutively at the surfaces of a plurality of substrates, and the relationship between the number of substrates processed and the film deposition speed, and the relationship between the number of substrates processed and the Sr/Ti composition ratio are investigated.

As a result, the film deposition speed is 10 nm/min for the first substrate and falls to 5 nm/min for the 15th substrate, which is a fall of 50%. Similarly, it can also be confirmed that the Sr/Ti composition ratio falls from 1.2 for the first substrate to 0.8 for the 16th substrate. Further, the plasma flickers for the 16th substrate onwards and stable discharge is therefore not possible.

As a result, the desired results cannot be obtained when holes are not formed in the surface even when opposing electrodes are provided. This is because the surface area of the opposing electrode does not become large when holes are not formed in the surface.

The inventor of the present invention prepared a plurality of different opposing electrodes of the same shape and size but with holes of different diameters, depths and of different numbers of holes in order to investigate the relationship between the diameter, depth and number of holes formed in the surface of the opposing electrode 21 and the film deposition speed Sr/Ti composition ratio. The opposing electrodes employed in each case were 26 cm discs with circular through-holes of 20 cm in diameter at the center. The opposing eletrodes prepared in this manner are then provided at the sputtering apparatus 1 shown in FIG. 1, $SrTiO_3$ thin films are deposited consecutively at a plurality of substrates and the relationship between the film deposition speed and the Sr/Ti composition ratio is then investigated for each opposing electrode. The results for this are shown in the following Table

TABLE 1

| Hole diameter (cm) | Hole depth (cm) | Number of Holes | Surface area ($cm^2$) | Number of substrates for which the film deposition speed and Sr/Ti composition ratio remain constant |
|---|---|---|---|---|
| 0 | 0 | 0 | 217 | Not constant, discharge becomes unstable |
| 0.5 | 1 | 72 | 330 | 10 |
| 1 | 2 | 40 | 468 | 5 |
| 1 | 0.5 | 40 | 280 | Not constant, discharge becomes unstable |
| 2 | 2 | 16 | 417 | Not constant |
| 2 | 4 | 8 | 417 | 4 |

The surface area of the opposing electrodes is larger when the diameter and depth of holes formed in the surface is large and is also larger when the number of holes is large. However, it can be understood from Table 1 above that the film deposition speed and Sr/Ti composition ratio become unstable for opposing electrodes with shallow holes where the ratio of the depth of the holes with respect to the diameter is less than 2.

Further, a substrate of a diameter of 20 cm is used as the substrate, with the surface area being 314 $cm^2$. However, it can also be understood that discharge is unstable when the surface area of the opposing electrodes is smaller than the surface area of 314 $cm^2$ of the substrate.

On the other hand, when deep holes where the ratio of the depth of the holes with respect to the diameter is two or more are formed and an opposing electrode with a surface area larger than the surface area of the substrate is employed, after film deposition commences, the film deposition speed and Sr/Ti composition ratio is fixed for a few to ten or so substrates, and can be kept fixed when depositing films thereafter. It can be considered that this is because it becomes difficult for dielectric to become attached to the side walls of the holes when the holes become deep. It is therefore preferable to employ an opposing electrode where deep holes are formed in the surface and where the surface area is large in order to ensure that film deposition speed and Sr/Ti composition ratio remain fixed even when dielectric films are formed consecutively. It is preferable for the depth of the holes to be at least double the size of the diameter of the holes, for example, four times the size of the diameter of the holes.

The inventor of the present invention also provided opposing electrodes of different shapes as the opposing electrode 21 at the sputtering apparatus 1 in the course of extensive investigation and $SrTiO_3$ thin films where then consecutively formed on surfaces of a plurality of silicon substrates using this device.

Figure 6A:
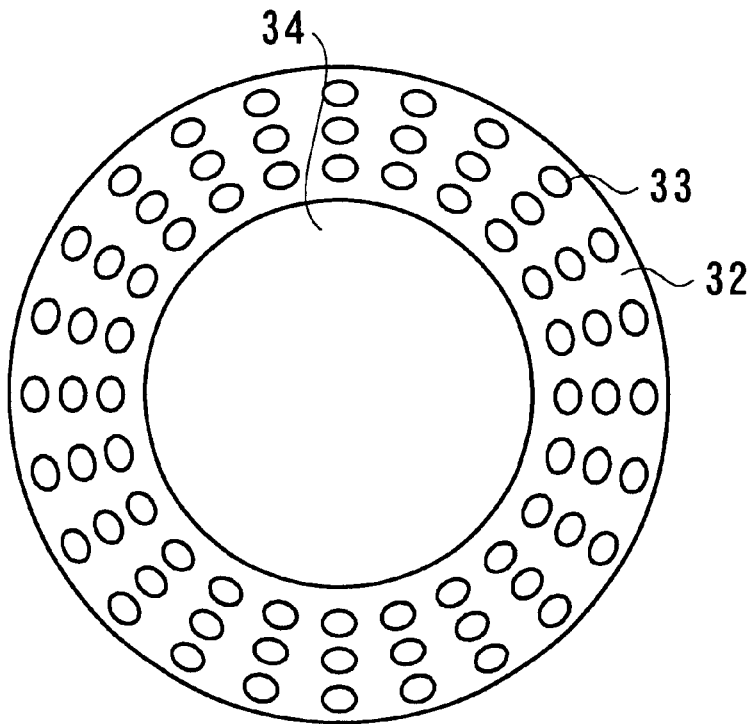
FIG. 6(a) is a plan view illustrating an example of a further opposing electrode employed by a sputtering apparatus of the first embodiment of the present invention.
Figure 6B:
FIG. 6(b) is a cross-sectional view illustrating an example of the further opposing electrode employed by a sputtering apparatus of the first embodiment of the present invention.

The detailed structure of opposing electrodes is shown by reference numeral 31 in FIG. 6(a) and FIG. 6(b). Forming a plurality of circular holes 33 in the surface of an aluminum disc 32 having a circular through-hole 34 in the center thereof is the same for the opposing electrode 31 as for the opposing electrode 21 shown in FIG. 2, but a point of difference with the opposing electrode 21 shown in FIG. 2 is that the surface of the disc 32 is inclined by 10 degrees to the outside with respect to the normal direction in the surface of the opening of the through-hole 34. This is the only point of difference and the diameter of the disc 32, the diameter of the through-hole 34 and the number, diameter and depth of the holes 33 etc. is the same as for the opposing electrode 21 shown in FIG. 2.

A plurality of substrates are then consecutively subjected to thin film processing using a sputtering apparatus provided with this opposing electrode 31 and the film deposition speed and Sr/Ti composition ratio for each substrate is successively measured. As a result, substantially the same results as were obtained for the sputtering apparatus 1 employing the opposing electrode 21 are obtained and the film deposition speed and Sr/Ti ratio are substantially fixed.

In this case, as the results measured for particles becoming affixed to the surfaces of substrates for the tenth substrate onwards, the number of particles of 0.3 $\mu$m in diameter or more becoming attached to each substrate was, on average, forty, and the number of particles was fewer compared to the sputtering apparatus 1 employing the opposing electrodes 21.

In the embodiment described above, discs 22 and 32 provided with through-holes 24 and 34 were used as the opposing electrodes 21 and 31, but the shapes of the opposing electrodes and through-holes of the present invention are by no means limited in this respect and may, for example, be rectangular.

Further, the planar shape of the holes 23 and 33 provided in the surfaces of the opposing electrodes 21 and 31 are circular, but the shapes of the holes of the opposing electrodes of the present invention are by no means limited in this respect, and, for example, holes with rectangular planar shapes may also be employed.

Still further, a sintered body of SrTiO$_3$ is employed as a target and an SrTiO$_3$ thin film is formed on the surface of a silicon substrate, but the present invention is by no means limited in this respect, and a dielectric sintered body of, for example, BaTiO$_3$, (BaSr)TiO$_3$, Pb(ZrTi)O$_3$ or SrBi$_2$Ta$_2$O$_9$ may be employed as the target for forming the dielectric films.

Moreover, in this embodiment, the target 13 and the mounting table 15 are located at the top and the bottom within the vacuum chamber 11, but the present invention is by no means limited in this respect and, for example, the mounting table may be located so that the normal direction of the surface of the mounting table 15 becomes horizontal, with the target 13 being located opposite.

Further, in the above embodiment, the opposing electrodes 21 and 31 are formed with a plurality of deep holes at the surface of a thick disc provided unevenly at the surface, but the present invention is by no means limited in this respect, and, for example, a multiplicity of bar-shaped projections may be provided at the surface of a shallow plate, so as to provide unevenness.

Discharge is stable, and film deposition speed and Sr/Ti composition ratio can be kept constant even when dielectric films are formed consecutively.

What is claimed is:

1. A sputtering apparatus comprising:
    a vacuum chamber;
    a target positioned within the vacuum chamber;
    a substrate support, located within the vacuum chamber opposite the target, capable of supporting a substrate; and
    an opposing electrode connected to earth located about the periphery of the substrate support with a surface thereof facing the target, the surface being uneven, wherein the unevenness of the surface is comprised of a plurality of holes formed in the surface of the opposing electrode.

2. The sputtering apparatus of claim 1, wherein a depth of the holes is at least twice a diameter of the holes.

3. The sputtering apparatus of claim 1, wherein the target is positioned on a side of an inside ceiling of the vacuum chamber, the opposing electrode being located at an inner bottom side of the vacuum chamber,
    and wherein a surface of the opposing electrode is inclined in such a manner that a height of an outer side is lower than a height of the inner side.

4. The sputtering apparatus of claim 3, wherein the surface of the opposing electrode is inclined by at least 10° with respect to a horizontal plane.

5. The sputtering apparatus of claim 1, wherein the target is a dielectric selected from the group consisting of BaTiO$_3$, SrTiO$_3$, (BaSr)TiO$_3$, Pb(ZrTi)O$_3$, and SrBi$_2$Ta$_2$O$_9$.

6. The sputtering apparatus of claim 1, wherein only the opposing electrode is connected to earth within the vacuum chamber.

* * * * *